United States Patent [19]

Hanak

[11] 4,162,505

[45] Jul. 24, 1979

[54] INVERTED AMORPHOUS SILICON SOLAR CELL UTILIZING CERMET LAYERS

[75] Inventor: Joseph J. Hanak, Lawrenceville, N.J.

[73] Assignee: RCA Corporation, New York, N.Y.

[21] Appl. No.: 899,564

[22] Filed: Apr. 24, 1978

[51] Int. Cl.² .............................................. H01L 27/14
[52] U.S. Cl. .......................................... 357/30; 357/2; 357/61; 357/54
[58] Field of Search .................... 357/2, 30, 16, 61, 54

[56] References Cited

U.S. PATENT DOCUMENTS

| | | | |
|---|---|---|---|
| 3,843,420 | 10/1974 | Gittleman | 148/31.55 |
| 3,919,589 | 11/1975 | Hanak | 315/71 |
| 4,064,521 | 12/1977 | Carlson | 357/2 |
| 4,071,426 | 1/1978 | Pinch | 204/192 F |
| 4,126,150 | 11/1978 | Bell | 136/89 |

OTHER PUBLICATIONS

Wronski et al., *J. Appl. Phys.*, vol. 45, No. 1, 1974, pp. 295 et seq.
Wronski et al., *IEEE Transactions on Electronic Devices*, vol. ED-24, No. 4 (1977), pp. 351-357.
Lehmann, *J. Appl. Phys.*, vol. 43, No. 4, Apr. 1972, pp. 1666 et seq.
Carlson, *IEEE Transactions on Electron Devices*, vol. ED-24, No. 4, Apr. 1977, pp. 449 et seq.
Hanak, Journal of Materials Science, vol. 5, pp. 964 et seq., 1970.
Hanak, *J. Appl. Phys.*, vol. 44, No. 11, pp. 5142 et seq., 1973.
Abeles, *Appl. Phys. Solid State Sci.*, Academic Press, vol. 6, 1976, pp. 407 et seq.

*Primary Examiner*—Martin H. Edlow
*Attorney, Agent, or Firm*—Birgit E. Morris; A. Stephen Zavell

[57] ABSTRACT

An amorphous silicon solar cell incorporating a transparent high work function metal cermet incident to solar radiation and a thick film cermet contacting the amorphous silicon opposite to said incident surface.

11 Claims, 2 Drawing Figures

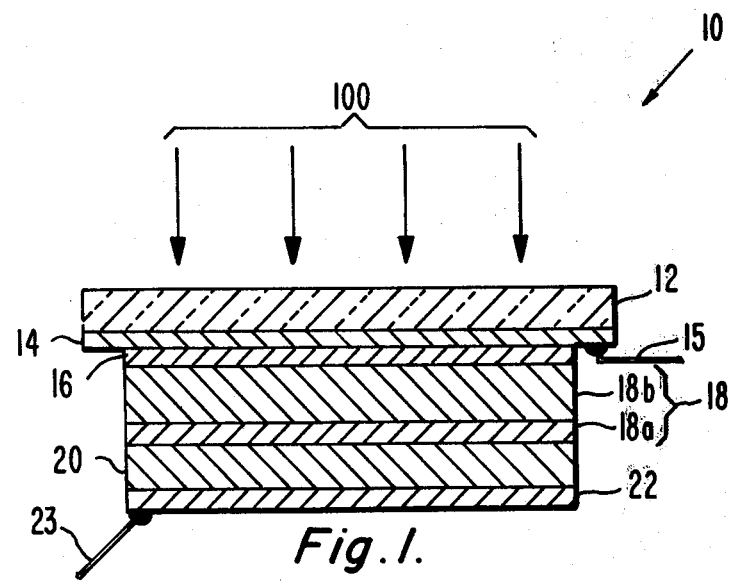
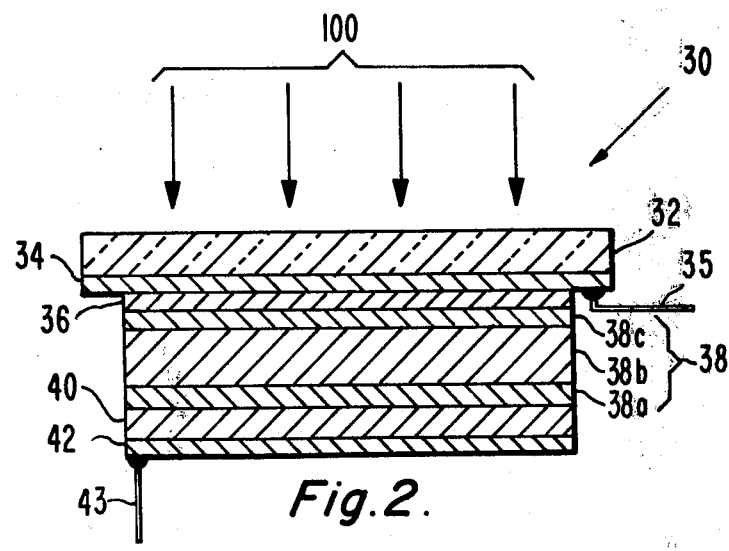

INVERTED AMORPHOUS SILICON SOLAR CELL UTILIZING CERMET LAYERS

This invention relates to solar cells. More specifically, this invention relates to amorphous silicon solar cells.

The invention described herein was made in the performance of an Energy Research and Development Administration Contract EY-76-C-03-1286.

CROSS REFERENCE TO RELATED APPLICATIONS

Cermet Schottky Barrier For Amorphous Silicon Solar Cells, by Joseph John Hanak, filed concurrently herewith and incorporated herein by reference.

BACKGROUND OF THE INVENTION

Photovoltaic devices such as solar cells are capable of converting solar radiation into useable electrical energy. The active solar cell semiconductor material can have a crystalline structure, e.g., single crystalline or polycrystalline silicon, or a non-crystalline structure, e.g., amorphous silicon. Energy conversion occurs as the result of what is well known in the solar cell field as "photovoltaic effect." Two basic steps are involved in the photovoltaic effect. Initially, solar radiation absorbed by the semiconductor generates electrons and holes. Secondly, the electrons and holes are separated by a built-in electric field in the semiconductor solar cell. This separation of electrons and holes results in the generation of an electrical current. A built-in electric field can be generated in a solar cell by, for example, a Schottky barrier. The electrons generated at the metal (Schottky barrier) semiconductor body junction flow towards the semiconductor body.

Cermets, also known as granular metals, are composite materials consisting of finely dispersed mixtures of immiscible metals and insulators, which are known to act as Schottky barriers to N-type single crystal silicon and gallium arsenide, see, J. Appl. Phys., Vol. 45, No. 1, Jan., 1974. However, due to the differences between crystalline and amorphous silicon, IEEE Transactions On Electronic Devices, Vol. ED-24, No. 4, April, 1977, no conclusions can be extrapolated from single crystalline silicon as to the effect of cermets on amorphous silicon. Metals which function as Schottky barriers to N-type single crystal silicon, such as nickel, tend to form ohmic contacts instead to intrinsic or insulating amorphous silicon.

Hydrogenated amorphous silicon solar cells, described in U.S. Pat. No. 4,064,521 to Carlson, herein incorporated by reference, are capable of converting solar radiation into useable electric energy. The hydrogenated amorphous silicon solar cells are fabricated by glow discharging silane ($SiH_4$) to form a body of hydrogenated amorphous silicon and thereafter evaporating platinum or another high work function metal onto the deposited body of hydrogenated amorphous silicon. The Schottky barrier formed by the evaporation of the metal exhibits inferior diode characteristics immediately after formation and requires annealing at about 200° C. for about 15 minutes. This is a time consuming process which adds to the cost of the final cell.

Attempts to further reduce the cost and speed the processing of hydrogenated amorphous silicon solar cells by sputtering the platinum films result in abnormally high percentages of solar cells with shorts or shunts. Electrical shorts occur when there is a pinhole in the amorphous silicon body and the front and back electrodes are touching. A shunt is the loss of charge in the amorphous body due to imperfect barrier formation or the formation of an ohmic contact by the high work function metal rather than Schottky-like barrier formation. Electrical shorts and shunts either greatly reduce or completely eliminate the efficiency of the solar cell. The back electrode may also render the amorphous silicon solar cell susceptible to shorts or shunts which can further degrade the overall performance and conversion of solar radiation into useable electrical energy. In addition, the problems of solar cell defects which cause shorts or shunts greatly increase with increasing solar cell size.

Thus, it would be highly desirable to find materials which can be applied to amorphous silicon by either sputtering or co-sputtering, to speed the processing, and minimize and localize the effects of electrical shorts and shunts.

SUMMARY OF THE INVENTION

A hydrogenated amorphous silicon solar cell incorporating a transpatent high work function metal cermet on the body of hydrogenated amorphous silicon incident to solar radiation and a thick metal cermet opposite to the incident surface which forms a back electrode to the amorphous silicon layer.

BRIEF DESCRIPTION OF THE DRAWINGS

FIG. 1 is a cross-sectional view of a transparent high work function metal cermet Schottky barrier hydrogenated amorphous silicon solar cell incorporating a thick metal cermet layer.

FIG. 2 is a cross-sectional view of an inverted PIN hydrogenated amorphous silicon solar cell incorporating a transparent high work function metal cermet and a thick metal cermet layer.

DETAILED DESCRIPTION OF THE INVENTION

The cermets useful herein have the following general formula:

$$M_x I_{(1-x)}$$

wherein M is a metal, I is an insulator or a ceramic insulator and x is the total volume of the cermet which is metal and can vary from about 0.10 to about 1.00. The insulator I is selected from the group consisting of $SiO_2$, $Al_2O_3$, $Si_3N_4$, BN, MgO, $TiO_2$, $ZrO_2$, $Si_WO_YN_Z$ (silicon oxynitride), ceramics which have bandgaps higher than about 4 eV and are transparent to visible light at all wavelengths, and the like.

The cermet incident to solar radiation, i.e., front cermet, incorporates a transparent high work function metal, such as platinum, iridium, rhodium, rhenium, and the like. The metal concentration x can vary from about 0.10 to about 0.85 and preferably is from about 0.25 to to about 0.45 of the total volume of the cermet. This cermet layer is from about 50 to about 200 angstroms thick. The cermet acts like a Schottky barrier in an hydrogenated amorphous silicon solar cell or adheres well to the P+ type layer in a PN or PIN hydrogenated amorphous silicon solar cell. The cermet provides a good ohmic contact to a transparent conductive oxide electrode deposited on said cermet.

The thick metal cermet, i.e., back electrode cermet, is from about 20 to about 100 times thicker than the front cermet and through the use of different metals provides a ballast resistor type of contact which localizes and protects the amorphous silicon solar cell against electrical shorts and shunts. Suitable thick film cermet metals include nickel, niobium, molybdenum, tungsten, titanium, and the like.

The resistance of the back cermet should be 1 to about 1/100th of the resistance of the N-type hydrogenated amorphous silicon layer and x should vary from about 0.20 to about 0.75 and preferably from about 0.40 to about 0.55 based on the total volume of the cermet. Preferably, the metal should not react with the dielectric contained in the cermet nor with the hydrogenated amorphous silicon body. In addition, the thick metal cermet should not be easily oxidized. The bulk resistivity can vary from about 10 $\Omega$ cm to about $10^4$ $\Omega$ cm in a cermet coating which is from about 2,000 to about 15,000 angstroms thick and preferably 5,000 to about 12,000 angstroms thick. In addition, the thick metal cermets should be as thick or thicker than the semiconductor film in order to minimize the effect of shorts and shunts in the amorphous silicon layer.

FIG. 1 illustrates an inverted hydrogenated amorphous silicon Schottky barrier solar cell 10. The solar cell 10 comprises a glass substrate 12 through which impinging solar radiation 100 passes. The glass should have a high optical transmittance and match the coefficient of expansion of amorphous silicon as closely as possible. In addition, the surface of the glass should be as smooth as possible to reduce the incidence of pinholes and shorts in the subsequently layered structure. Suitable glasses are soda lime glass, fused silica, borosilicate glass, and the like.

A transparent conductive oxide layer 14, such as indium tin oxide, tin oxide, cadmium stannate, or antimony tin oxide, and the like, is deposited on substrate 12. The transparent conductive oxide layer 14 serves as an antireflection coating and an electrode for the amorphous silicon solar cell 10. Preferably, the transparent conductive oxide should have a resistance of at least about 10 $\Omega/\square$ or lower and form an ohmic contact to the subsequently co-sputtered cermet layer 16, incident to solar radiation, which acts like a Schottky barrier to the hydrogenated amorphous silicon layer 18. The transparent conductive oxide is from about 2,000 to about 10,000 angstroms thick. The thickness of the transparent conductive oxide should be optimized for its antireflection properties by methods known in the art. With large area hydrogenated amorphous silicon cells, i.e., greater than 3 cm$^2$ in area, the transparent conductive oxide layer can be supplemented by grid structures known in the art to withdraw the current generated during the operation of the solar cell. Wire 15 forms an ohmic contact to the transparent conductive oxide layer 14. The transparent high work function metal cermet layer 16 is co-sputtered with a radio frequency (RF) above about 3 megahertz (MHz) onto the transparent conductive oxide layer 14 to a thickness of about 20 to about 200 angstroms and preferably about 80 to about 120 angstroms thick.

The hydrogenated amorphous silicon layer 18 is deposited in accordance with U.S. Pat. No. 4,064,521, and varies from intrinsic or insulating type, 18b, to N+ type shown as 18a. The N+ type layer 18a is approximately 400 angstroms thick and the intrinsic layer 18b is about 5,000 to about 10,000 angstroms thick.

The thick metal cermet layer 20 is deposited on the hydrogenated amorphous silicon layer 18 by co-sputtering, with an RF above about 3 MHz, a suitable metal and insulator to a thickness of from about 5,000 to about 15,000 angstroms and thereafter, overcoating said thick metal cermet layer with a metal layer 22 about 1,000 angstroms thick of a suitable metal such as niobium, aluminum, nickel, and the like, forming an ohmic contact to the thick metal cermet layer 20. Optionally, an encapsulating layer (not shown) may be deposited on the metal contact 22. A wire 23 or other suitable means for withdrawing the current generated during the irradiation of the cell with solar radiation 100 is attached to the metal electrode 22.

The absorption of solar radiation 100 in the body of hydrogenated amorphous silicon 18 generates carriers, i.e., electrons and holes, which are swept to either the thick metal cermet 20 or the high work function metal cermet 16 where they are collected as the electrical current generated by the cell.

FIG. 2 illustrates an inverted PIN amorphous silicon solar cell 30. Solar cell 30 comprises a glass substrate 32 with a transparent conductive oxide layer 34 about 2,000 to about 5,000 angstroms thick deposited thereon. A transparent high work function metal cermet layer 36 about 50 to about 200 angstroms thick is deposited on and forms an ohmic contact to the transparent conductive oxide layer 34. Wire 35 is ohmically attached to the transparent conductive oxide layer 34 to withdraw the current generated during the solar irradiation of the solar cell 30 by solar radiation 100. A PIN hydrogenated amorphous silicon layer 38 is deposited on the transparent high work function metal cermet layer 36 according to Carlson, supra. The hydrogenated amorphous silicon P+ type layer 38c is about 100 to about 300 angstroms thick and adheres well to the high work function metal cermet layer 36. The intrinsic layer 38b is from about 5,000 to about 10,000 angstroms thick. An N+ type layer 38a which is about 200 to about 500 angstroms thick is deposited on the intrinsic layer 38b. A thick metal cermet layer 40 about 5,000 to about 15,000 angstroms thick is deposited on the amorphous silicon layer 38. The thick metal cermet layer 40 forms an ohmic contact to the amorphous silicon layer 38. A metal layer 42 is deposited on the thick metal cermet layer 40. The metal layer 42 forms an ohmic contact to the thick metal cermet layer 40. A wire 43 is ohmically attached to the metal layer 42 to withdraw the current generated during the operation of the solar cell 30.

The use of a high work function metal cermet incident to solar radiation and a thick metal cermet permits the amorphous silicon solar cell to be made in one chamber in a series of sequential steps. The ability to make the solar cell in sequential steps shortens the processing time. In addition, cermet films allow the making of large area solar cells without excessive shorts and shunts in the solar cell structure.

As an example, a glass substrate made out of float glass, particularly suitable because of its smoothness, is selected and washed in a detergent solution in an ultrasonic bath and thereafter rinsed with water and dried by dust free hot air at about 100° C. Indium tin oxide is RF sputtered onto the glass substrate to a resistance of about 10 $\Omega/\square$. The RF generator is operated at a frequency of about 15.6 MHz. The sputtering targets were discs 14.6 cm in diameter. Thereafter, a mica mask is made to cover a narrow border around the substrate to prevent the deposition of subsequent films on the indium tin oxide and to provide a space for a wire or suitable current withdrawing means to be attached thereto. The system is pumped down to about $5 \times 10^{-7}$ Torr and the substrate is heated to about 230° C. and argon gas is bled into the system at the rate of about 5 sccm. The argon gas flow is maintained such that there is an argon pressure of about 5 Torr in the sputtering chamber. The target is pre-sputtered with a shutter over the substrate for 15 minutes and thereafter the shutter is opened and the sputtering continued for about 1.2 minutes during which time about 80 angstroms of Pt-SiO$_2$ cermet with a platinum concentration of about 25 to about 40% of the total cermet volume is deposited. With the system pressure at $5 \times 10^{-7}$ Torr the substrate is further heated to about 330° C. and the appropriately doped layers of amorphous silicon are applied in accordance with Carlson, supra. However, RF capacitive discharge is used instead of Direct Current (DC) discharge as the power source. About 25 seconds is required to deposit about 200 angstroms of P+ type hydrogenated amorphous silicon. The intrinsic layer is deposited to a thickness of about 5,000 angstroms in about 11 minutes. The N-type layer of hydrogenated amorphous silicon is deposited on the intrinsic hydrogenated amorphous silicon to a thickness of about 900 angstroms in about 2 minutes. The thick film cermet layer is deposited onto the amorphous silicon layer by RF sputtering from a target of Ni-SiO$_2$ cermet containing from about 40 to about 55 volume percent of nickel. Typically, about 60 minutes is sufficient to deposit about 9,000 angstroms of this cermet. After the deposition of the thick film cermet the mask is removed and a smaller mask put on the amorphous silicon solar cell and about 5,000 angstroms of aluminum is applied during 30 minutes of RF sputtering. Subsequently a wire is attached to the aluminum layer to withdraw current generated during the illumination of the amorphous silicon solar cell.

For the deposition of the amorphous silicon layers the flow of SiH$_4$ was 20 sccm. For P+ doping 0.05 B$_2$H$_6$ was added to the SiH$_4$ and for the N+ doping 0.1% PH$_3$ was used. The total pressure of the gases during the deposition of the amorphous silicon layers was about 20$\mu$. RF power of 80 W was used.

The skilled artisan will realize the thick film cermet can be used in other amorphous silicon solar cells such as non-inverted PIN structures, NP structures, I junction solar cells, heterojunction photovoltaic solar cells, and the like. In addition, if the thick film cermet is made absorbing for solar radiation that is not absorbed by amorphous silicon, i.e., the infrared portion of solar spectrum, then solar cells incorporating said cermet could double as photothermal converters with the circulation of a suitable heat exchange medium under the solar cell. Therefore, it is to be understood that I do not intend to limit my invention solely to the example described herein but rather it is my intention to include such modifications as would be obvious to the ordinary worker skilled in the design of solar cells.

I claim:

1. In an amorphous silicon solar cell which comprises a body of hydrogenated amorphous silicon with a means for ohmically contacting said body of hydrogenated amorphous silicon incident to solar radiation and a metal layer ohmically contacting said body of hydrogenated amorphous silicon opposite to said incident surface, the improvement which comprises:
   a transparent high work function metal cermet layer disposed between and contacting said means for forming an ohmic contact and said body of hydrogenated amorphous silicon; and
   a thick film cermet layer disposed between said metal layer ohmically contacting said body of hydrogenated amorphous silicon opposite to said incident surface and said body of hydrogenated amorphous silicon.

2. In an amorphous silicon solar cell which comprises a body of hydrogenated amorphous silicon with a metal layer contacting said body of hydrogenated amorphous silicon incident to solar radiation forming a Schottky barrier thereto, means for ohmically contacting said Schottky barrier and a metal layer ohmically contacting said body of hydrogenated amorphous silicon opposite to said incident surface, the improvement which comprises:
   utilizing a transpatent high work function metal cermet layer for said Schottky barrier; and
   a thick film cermet disposed between said metal layer ohmically contacting said body of hydrogenated amorphous silicon opposite to said incident surface and said body of hydrogenated amorphous silicon.

3. An amorphous silicon solar cell according to claim 1 or 2 wherein said thick film cermet has the formula:

$$M_x I_{(1-x)}$$

wherein M is a metal, I is an insulator, and x varies from about 0.20 to about 0.75.

4. An amorphous silicon solar cell according to claim 3 wherein the insulator is selected from the group consisting of SiO$_2$, Al$_2$O$_3$, Si$_3$N$_4$, BN, TiO$_2$, ZrO$_2$, MgO, silicon oxynitride, and insulating ceramics which have bandgaps higher than about 4 eV.

5. An amorphous silicon solar cell according to claim 4 wherein said metal is selected from the group consisting of nickel, niobium, molybdenum, tungsten, titanium, chromium, and iron.

6. An amorphous silicon solar cell in accordance with claim 5 wherein x varies from about 0.40 to about 0.55.

7. An amorphous silicon solar cell in accordance with claim 1 or 2 wherein said thick metal cermet is about 5,000 to about 15,000 angstroms thick.

8. An amorphous silicon solar cell in accordance with claim 1 or 2 wherein said thick metal cermet has a series resistance of about 1 to 1/100th of the hydrogenated amorphous silicon.

9. An amorphous silicon solar cell according to claim 3 wherein said body of hydrogenated amorphous is fabricated by a glow discharge in an atmosphere containing silicon atoms and hydrogen atoms.

10. An amorphous silicon solar cell according to claim 9 wherein said atmosphere contains silane.

11. An amorphous silicon solar cell according to claim 5 wherein said body of hydrogenated amorphous silicon is fabricated by a glow discharge in silane.

* * * * *